(12) United States Patent
Huang

(10) Patent No.: US 10,084,086 B2
(45) Date of Patent: Sep. 25, 2018

(54) HIGH PRESSURE LOW THERMAL BUDGE HIGH-K POST ANNEALING PROCESS

(71) Applicant: Shanghai Huali Microelectronics Corporation, Shanghai (CN)

(72) Inventor: Qiuming Huang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 15/429,194

(22) Filed: Feb. 10, 2017

(65) Prior Publication Data

US 2018/0175195 A1    Jun. 21, 2018

(30) Foreign Application Priority Data

Dec. 16, 2016 (CN) .......................... 2016 1 1167792

(51) Int. Cl.

| | |
|---|---|
| *H01L 29/06* | (2006.01) |
| *H01L 21/02* | (2006.01) |
| *H01L 29/78* | (2006.01) |
| *H01L 21/306* | (2006.01) |
| *H01L 29/08* | (2006.01) |
| *H01L 29/165* | (2006.01) |
| *H01L 29/66* | (2006.01) |
| *H01L 21/3065* | (2006.01) |
| *H01L 21/308* | (2006.01) |
| *H01L 29/167* | (2006.01) |
| *H01L 27/11* | (2006.01) |

(52) U.S. Cl.
CPC ...... *H01L 29/7848* (2013.01); *H01L 21/0262* (2013.01); *H01L 21/02381* (2013.01); *H01L 21/02532* (2013.01); *H01L 21/3065* (2013.01); *H01L 21/3081* (2013.01); *H01L 21/30604* (2013.01); *H01L 27/1104* (2013.01); *H01L 29/0847* (2013.01); *H01L 29/165* (2013.01); *H01L 29/167* (2013.01); *H01L 29/66636* (2013.01)

(58) Field of Classification Search
None
See application file for complete search history.

(56) References Cited

U.S. PATENT DOCUMENTS

| | | | |
|---|---|---|---|
| 8,853,060 B1* | 10/2014 | Lai .................... | H01L 21/02532 438/478 |
| 2014/0335674 A1* | 11/2014 | Liao ................. | H01L 29/66636 438/285 |
| 2016/0013316 A1* | 1/2016 | Kuang ............... | H01L 21/0243 257/190 |

* cited by examiner

*Primary Examiner* — Charles Garber
*Assistant Examiner* — Xiaoming Liu
(74) *Attorney, Agent, or Firm* — Kilpatrick Townsend & Stockton, LLP

(57) ABSTRACT

A method of embedding SiGe when fabricating a PMOS device is provided. Multiple layers of SiGe layers with different Ge contents may be formed such that the Ge content increases to from bottom layer(s) to middle layer(s), and decreases from the middle layer(s) to top layer(s). In some embodiments, the embedded SiGe can have a SiGe seed layer over a substrate, a first SiGe transition layer over the SiGe seed layer, a SiGe milled layer over the first SiGe transition layer, and a second SiGe transition layer over the SiGe middle layer. The first SiGe transition layer can have a Ge content increasing from a bottom of the first SiGe transition layer to a top of the first SiGe transition layer. The second SiGe transition layer can have a Ge content decreasing from a bottom of the second SiGe transition layer to a top of the second SiGe transition layer.

10 Claims, 7 Drawing Sheets

HIGH PRESSURE LOW THERMAL BUDGE HIGH-K POST ANNEALING PROCESS

BACKGROUND OF THE INVENTION

The present invention is directed to semiconductor processes and devices.

Since the early days when Dr. Jack Kilby at Texus Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microeletronic Corporation™ is one of the leading semiconductor fabrication companies that has focused on the research and development of semiconductor devices and processes.

Conventional device structures based on silicon germanium (SiGe) technology were developed to produce field effect transistors (FET). For example, a SiGe technology has been developed for a p-channel metal oxide semiconductor (PMOS) transistor through depositing a buried, pseudomorphically strained SiGe layer capped by an unstrained silicon (Si) layer. The silicon cap layer is partially oxidized to form a gate dielectric. Due to an offset in the valence band, the holes can be confined to the SiGe channel. In this design, dislocations in the SiGe film can be avoided if the SiGe film thickness is made very thin. Fabrication of this device is compatible with state-of-the art complementary metal oxide semiconductor (CMOS) processing.

Figure 1A:
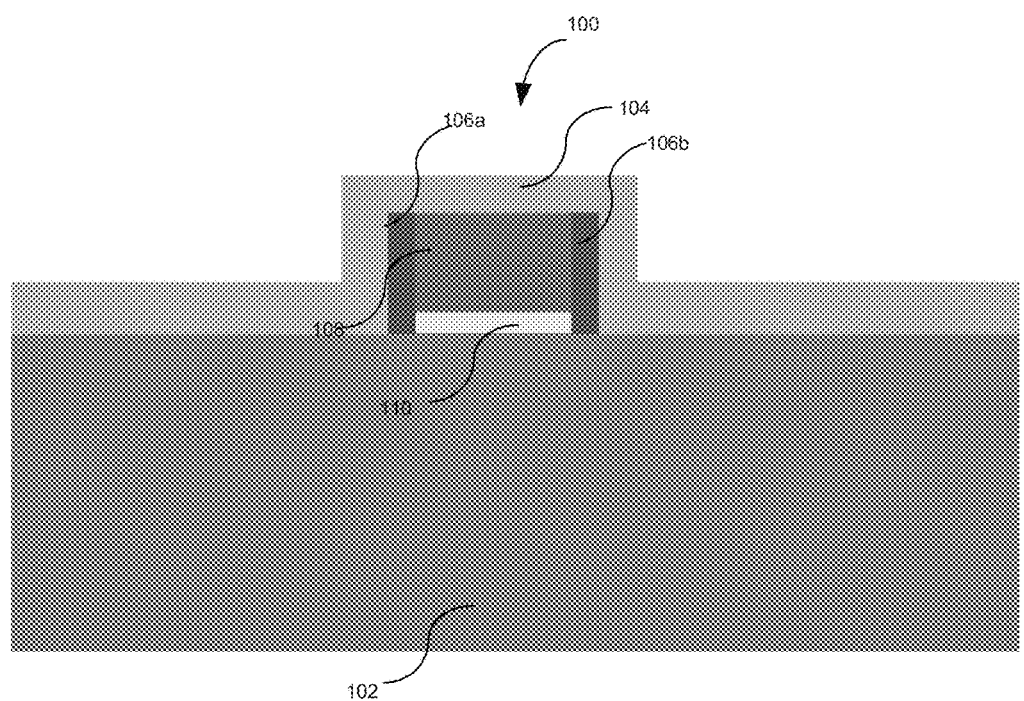
FIG. 1A illustrates a embedded SiGe process in accordance with the disclosure can include depositing a hard mask over the whole substrate.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present disclosure relates to fabrication of high-k/metal gate (HKMG) stacks for semiconductors, in particular to reducing diffusion of O2 into the IL after the HKMG stack is formed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In an embedded SiGe process for manufacturing a PMOS device, a cavity is typically formed in the source/drain regions of the PMOS device. Cavity formation is generally accomplished by a multi-step dry etch process, followed by a wet etch process. The first dry etch step is a first anisotropic dry etch used to etch through a deposited hard mask layer (e.g., silicon nitride) to begin etching of a cavity in the substrate (e.g., silicon), followed by an isotropic dry lateral etch (dry lateral etch) that expands the cavity including laterally toward the MOS transistor channel, followed by a second anisotropic dry etch to define the bottom wall of the cavity.

FIGS. 1A-1G illustrate a process flow incorporating embedded SiGe in a PMOS in accordance with an exemplary embodiment of the present disclosure. As shown in FIG. 1A, the process can include depositing a hard mask 102 over the whole substrate 102. In various implementations, hard mask 104 may be formed of SiN to a thickness according the application of the device incorporating PMOS 100. As shown, the hard mask 104 can be deposited over work function metal 108, such as titanium nitride (TiN), which can be provided over a high-k dielectric layer 110 on a substrate 102. As will be understood by one skilled in the art, the structure shown in FIG. 1 is a gate first HKMG stack, which can typically include spacers 106a and 106b as shown in FIG. 1. The substrate 102 can be, for example, a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Furthermore, the substrate 102 may be a semiconductor on insulator (SOI). In some examples, the substrate 102 may include a doped epitaxial (epi) layer. In other examples, the substrate 102 may include a multilayer compound semiconductor structure.

In various embodiments, the substrate 102 may include various doped regions depending on design requirements (e.g., p-type wells or n-type wells). The doped regions may be doped with p-type dopants, such as boron or BF2, and/or n-type dopants, such as phosphorus or arsenic. The doped regions may be formed directly on the substrate 102, in a P-well structure, in an N-well structure, in a dual-well structure, or using a raised structure. The semiconductor substrate 110 may further include various active regions, such as regions configured for an N-type metal-oxide-semiconductor transistor device (referred to as an NMOS) and regions configured for a P-type metal-oxide-semiconductor transistor device (referred to as a PMOS). For example, substrate 102 may have dopant regions and epitaxial layers formed to define source and drain regions.

Figure 1B:
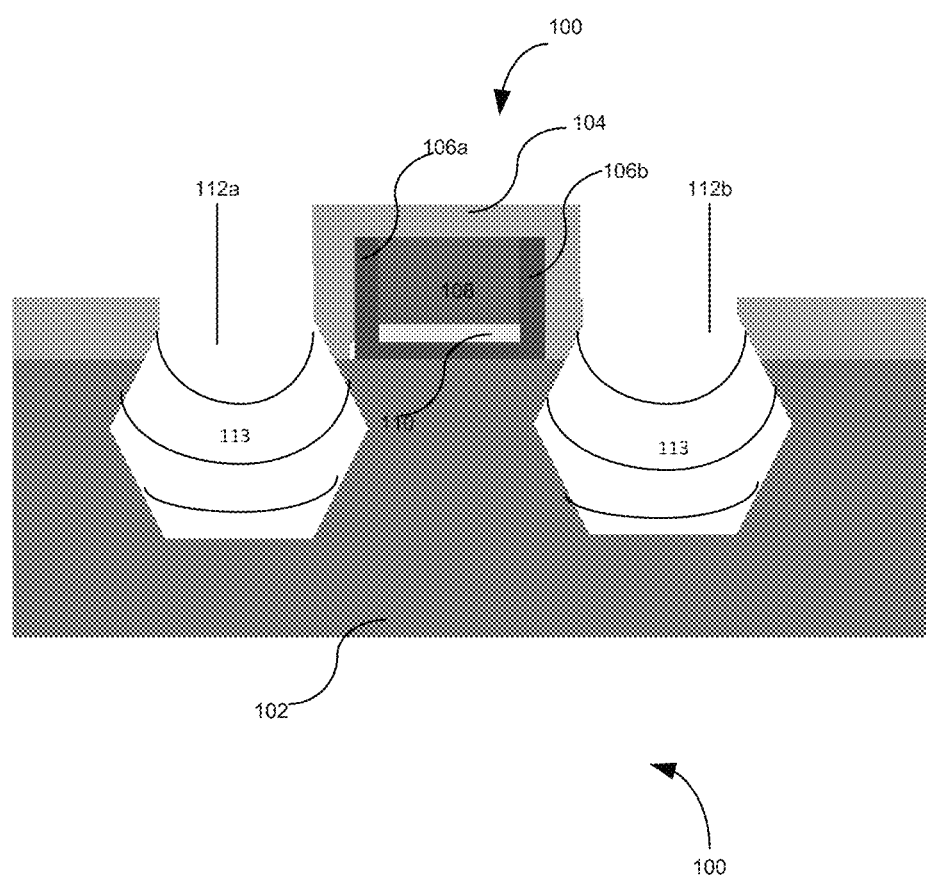
FIG. 1B illustrates the embedded SiGe process in accordance with the disclosure can include forming sigma shaped cavities on each side of PMOS after the hard mask is formed.

FIG. 1B illustrates the embedded SiGe process in accordance with the disclosure can include forming sigma shaped cavities 112a-b on each side of PMOS 100 after the hard mask 102 is formed. In some implementations, the cavities 112a-b can be formed by wet etching with tetramethylammonium hydroxide (TMAH) in the substrate 102 on each side of the PMOS 100 gate stack. Although other shapes are possible, the sigma shaped cavity allows very close proximities and therefore maximum stress inside the transistor channel region. The wet etchant for the crystallographic etch has crystal orientation selectivity to the substrate material, such as an etchant comprising TMAH, which can be used to etch the substrate beginning with the U-shaped recesses provided by the multi-step dry etch processing. During the wet crystallographic etching process, the etch rate of the <111> crystal orientation is less than that of other crystal orientations such as <100>. As a result, the U-shaped recesses become diamond-shaped recesses.

Also shown, after the cavities 112a-b are formed, SiGe 113 can be grown in the cavities 112a-b. In some implementations SiGe 139 is grown in the cavities 112a-b, for example by a low-pressure chemical vapor deposition (LP-CVD) process as an in-situ graded boron doped deposition for the deep source/drain areas of the PMOS 100. In-situ doping can be employed to allow high and uniform doping levels, which in turn reduces parasitic resistance and contact resistance, thereby allowing higher drive currents. Also, by doping the source/drain regions of the PMOS during the epitaxy, a dedicated source/drain implantation can be eliminated, thereby saving process costs for masks and implantation, reducing cycle time, and reducing stress relaxation from implant damage. Further, the boron dopants are activated by the epitaxy, thereby eliminating the need for an additional anneal. A slight overgrowth can help form a more solid encapsulation and margin for subsequent cleans that attack the active open silicon area. The overgrowth further provides extra margin for forming a solid salicide, for example nickel silicide (NiSi), and has better contact resistance.

During embedded SiGe process in accordance with the disclosure, concentration of Ge in the SiGe 114 grown in the cavities 112a-b can be controlled to increase compressive stress in the channel region of PMOS devices to improve device performance. However, it has been observed that when the concentration of Ge increases between the substrate 102 and the SiGe layer, a lattice mismatch between the two layers can also increase. This can cause the interface between the substrate and the SiGe layer to dislocate and thus to degrade the PMOS device performance.

In addition, due to crystal orientation selectivity of the SiGe epitaxial growth mentioned above (the SiGe growth at <100> is the fastest, at <110> is the second fastest, and at <111> is the slowest), when the SiGe epitaxial layer of the SRAM region is higher than the plane of the substrate, the <111> crystal face may be formed on both sides of the epitaxial layer. However, the <111> crystal plane can negatively affect the growth of the subsequent cap layer such that the cap layer of the SiGe in the SRAM region can grow unevenly (for example, crystal growth of the cap layer at <111> may not be enough to have an adequate thickness, or it does not grow at all). Moreover, a SiGe region with a high germanium content at the epitaxial layer may not or may not sufficiently react with metallic nickel to form NiSi or NiGeSi. This can resulting in poor contact between the subsequent CT and SiGe layer to cause leakage, increase of resistance, difficulty in controlling the resistance, and/or any other problems.

To address the aforementioned problems, the embedded SiGe process in accordance with the disclosure introduces a novel approach, under which the Ge content in the source and drain regions of the embedded SiGe can be increased. Under this novel approach, the aforementioned dislocation between the substrate and the embedded SiGe can be eliminated or reduced. In addition, under this novel approach, the aforementioned cap layer content may also be improved to help the growth of NiSi.

In accordance with one aspect of the present disclosure, when embedding the SiGe in cavities 112a-b, multiple layers of SiGe layers with different Ge contents may be formed such that the Ge content increases to from bottom layer(s) to middle layer(s), and decreases from the middle layer(s) to top layer(s). In some embodiments, one or more seed layers of SiGe can be first grown on the bottom and sidewall of the cavities 112a-b. One or more layers of germanium can then be grown on the SiGe seed layer(s) to form one or more first SiGe transition layers. The first SiGe transition layer(s) may have a Ge content increasing from the bottom of the first SiGe transition layer(s) to the top the first SiGe transition layer(s). Still in those embodiments, one or more SiGe middle layers with high Ge content can be formed over the first SiGe transition layer(s). The SiGe middle layer(s) may have Ge content equal to or higher than the highest Ge content in the first SiGe transition layer. Finally, in those embodiments, one or more second transition SiGe layers can be grown over the SiGe middle layer(s). The second SiGe transition layer(s) may have a Ge content decreasing from the bottom of those transition layers to the top of those transition layers. A cap layer can finally be formed over the second SiGe transition layer(s).

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

Figure 1C:
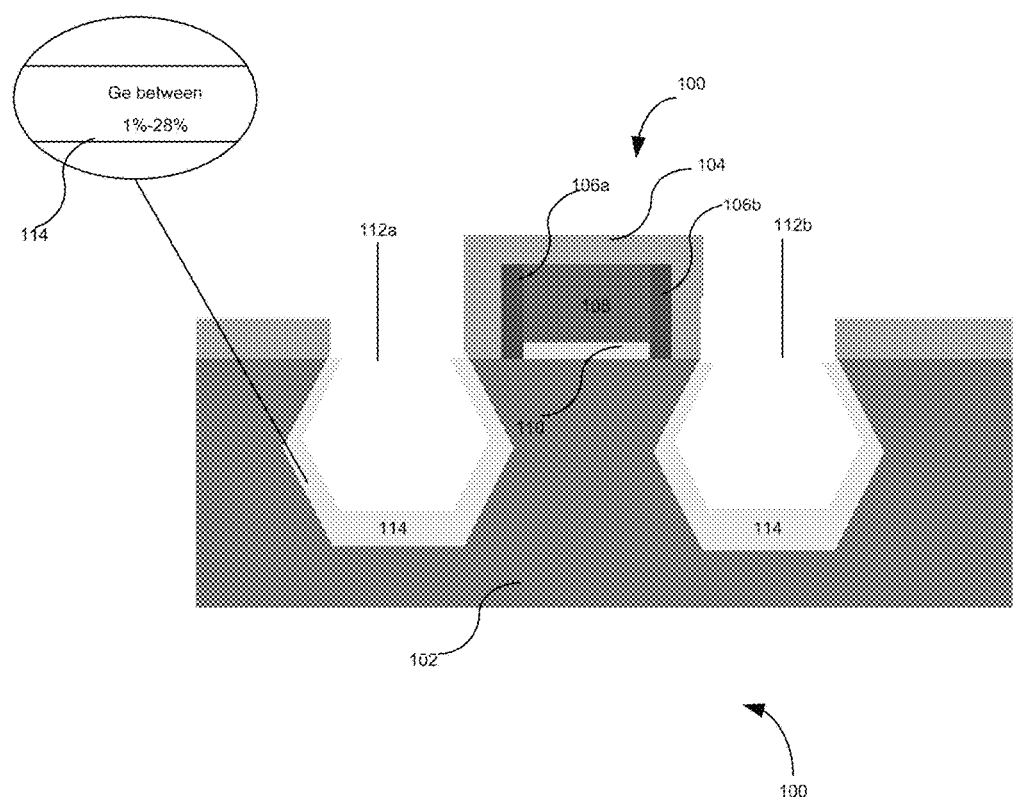
FIG. 1C illustrates the embedded SiGe process in accordance with the disclosure can grow a SiGe seed layer 114 in the cavities after the cavities are formed.
Figure 1D:
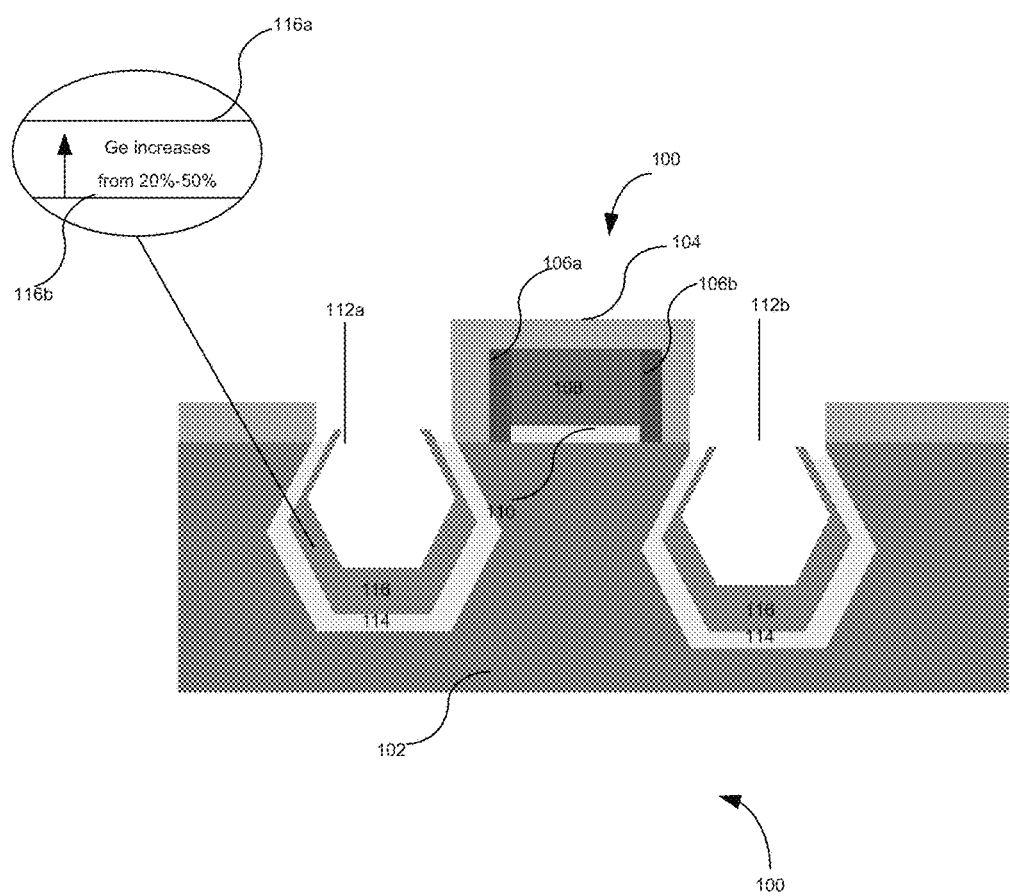
FIG. 1D illustrates a first transition SiGe layer can be formed during the process after the SiGe seed layer is formed.

FIGS. 1C-F illustrate growing the embedded SiGe gradually in the embedded SiGe process in accordance with the disclosure. They will be described with reference to FIGS. 1A-B. FIG. 1C illustrates the process can grow a SiGe seed layer 114 in the cavities 112a-b after cavities 112a-b are formed and the Ge content in SiGe seed layer 114 can be between 1%-28%. In some implementations, the thickness of the SiGe seed layer 114 can be between 10-300 angstroms. FIG. 1D illustrates a first transition SiGe layer 116 can be formed during the process after the SiGe seed layer 114 is formed. The content of Ge in the first SiGe transition layer 116 can be between 20-50%. As shown, the Ge content in the first SiGe transition layer 116 can gradually increase from the bottom of the first SiGe transition layer 116b to the top of the first SiGe transition layer 116a. For example, around the bottom 116b, the Ge content can be around 30%, and around the top 116a, the Ge content can be around 50%. In some implementations, the Ge content of the first transition layer 116 at bottom 116b may be the same as or substantially similar to the Ge content in the SiGe seed layer 114. For example, the SiGe seed layer 114 and the bottom layer 116b can both have Ge content around 20%. In some implementations, the thickness of the first SiGe transition layer 116 can be between 30-500 angstroms.

Figure 1E:
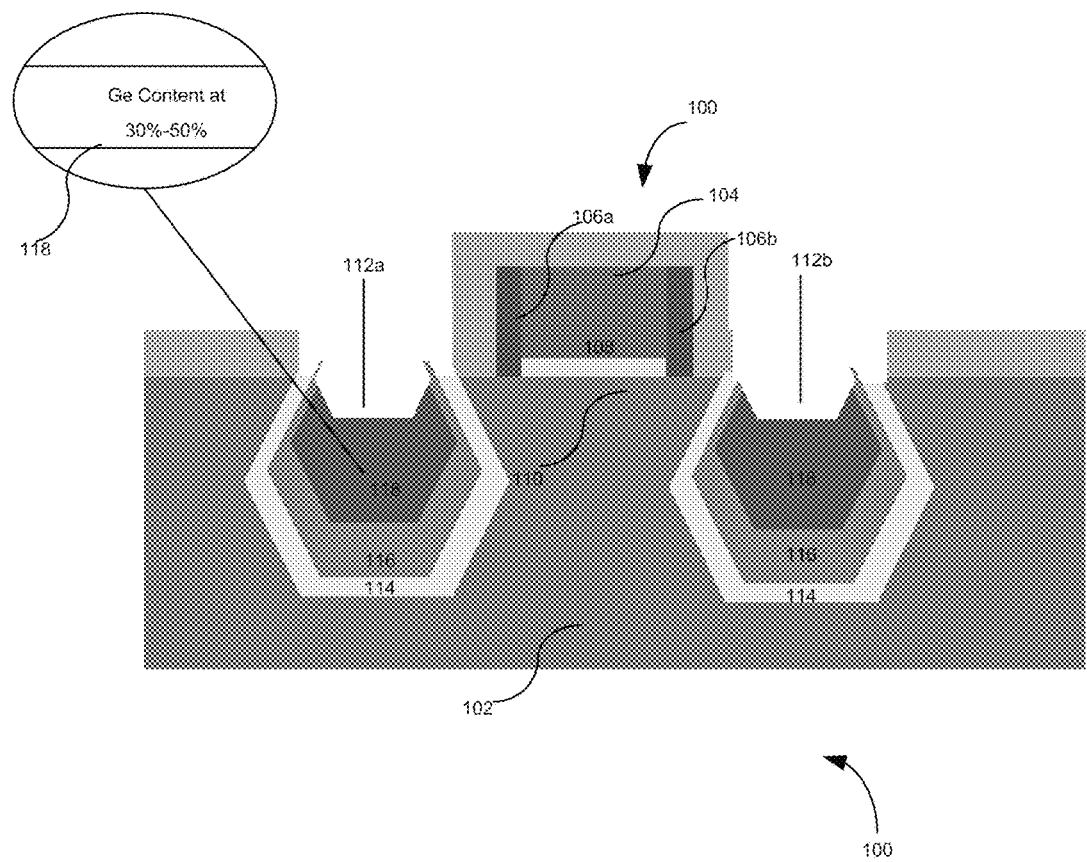
FIG. 1E illustrates the embedded SiGe process in accordance with the disclosure can grow a SiGe middle layer after the first SiGe transition layer is formed.

FIG. 1E illustrates the process can grow a SiGe middle layer 118 after the first SiGe transition layer 116 is formed. The Ge content in SiGe middle layer 118 can be between 30%-50%. The Ge content in the SiGe middle layer 118 may be the same or substantially similar to the Ge content in the top 116a of the first SiGe transition layer 116. For example, around the top 116a, the first SiGe transition layer may have 40% Ge, the SiGe middle layer 118 can then also have around 40% Ge content. In some implementations, the thickness of the SiGe middle layer 118 can be between 100-800 angstroms. In some implementations, the top of the SiGe middle layer 118 may be deposited in the cavities 112a-b to be level or substantially level with the surface of substrate 102. However, this is not intended to be limiting. In some other implementations, the top of the SiGe middle layer 118 may be deposited in the cavities 112a-b to be lower or higher the surface of substrate 102.

Figure 1F:
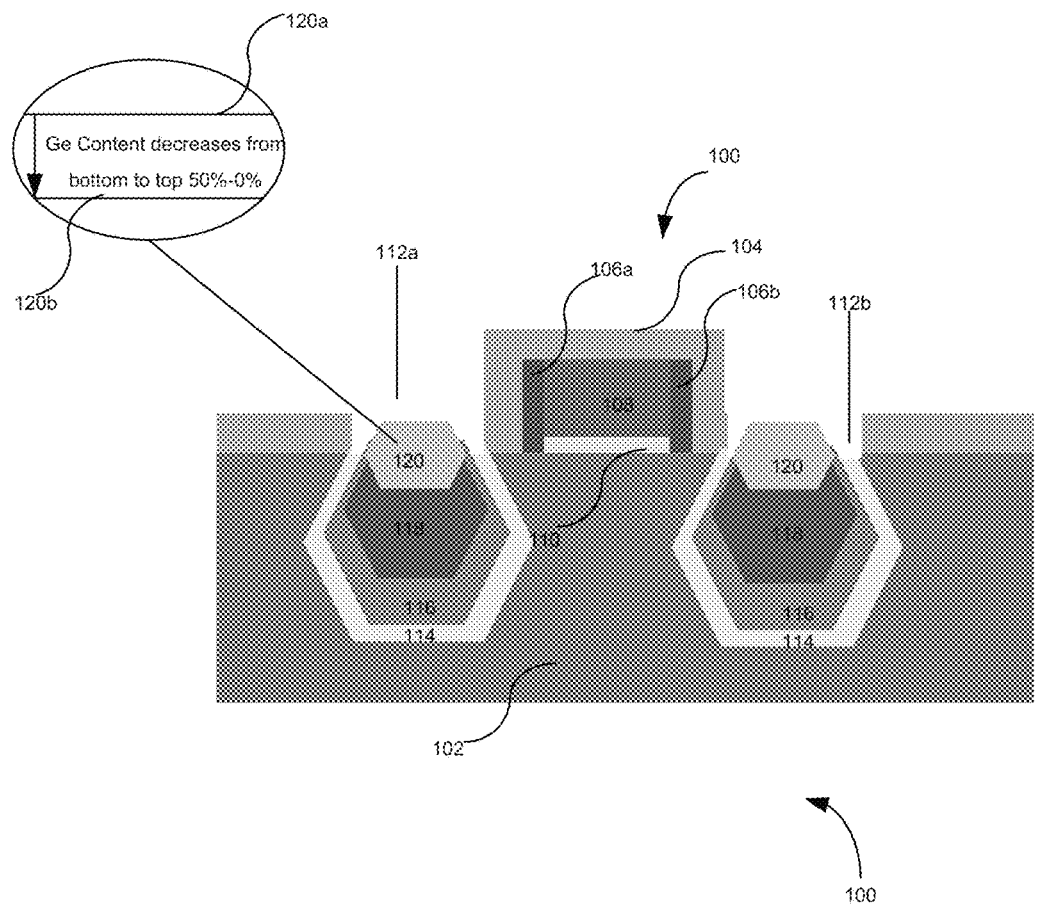
FIG. 1F illustrates a second transition SiGe layer can be formed during the embedded SiGe process in accordance with the disclosure after the SiGe middle layer is formed.

FIG. 1F illustrates a second transition SiGe layer 120 can be formed during the process after the SiGe middle layer 116 is formed. The content of Ge in the second SiGe transition layer 120 can be between 0-50%. As shown, the Ge content in the second SiGe transition layer 120 can gradually decrease from the bottom of the second SiGe transition layer 120b to the top of the second SiGe transition layer 120a. For example, around the bottom 120b, the SiGe content can be around 50%, and around the top 120a, the SiGe content can be around 0%. In some implementations, the Ge content of the second transition layer 120 at bottom 120b may be the same as or substantially similar to the Ge content in the SiGe middle layer 116. For example, the SiGe middle layer 116 can have Ge content at 50%. In some implementations, the thickness of the SiGe seed layer can be between 100-300 angstroms.

Figure 1G:
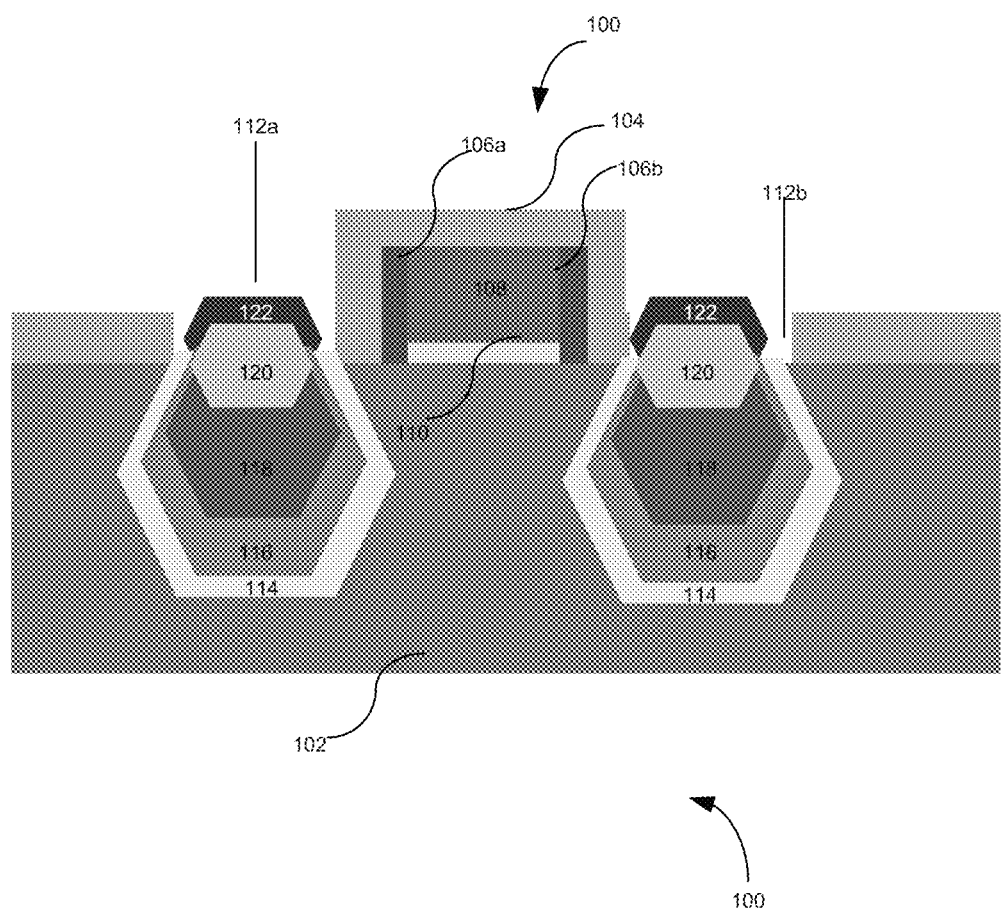
FIG. 1G illustrates a cap layer can be formed over the second SiGe transition layer during the embedded SiGe process in accordance with the disclosure.

In some implementations, the embedded SiGe as shown in FIGS. 1C-F can be grown by any suitable process such as, chemical vapor deposition (CVD), atomic layer deposition (ALD), low-pressure CVD (LPCVD), or any other suitable process for growing embedded SiGe as known in the art. The gas that can be used to grow the embedded SiGe as shown in FIGS. 1C-F may include SiH4, SiH2C12, HCL, H2, GeH4, B2H6 and/or any other gas. When H2 is used, a flow of H2 may be controlled between 1000 sccm~60000 sccm and gaseous gas flow may be controlled between 0.1 sccm~1200 sccm. When GeH4, and SiH4 or SiHC2CI2 are used, GeH4, and SiH4 or SiH2C12 flow ratio may be controlled at 1:0.01 to 1:100. When GeH4 and HCL are used, their flow ratio may be controlled at 1:0.05 to 1:50. In various embodiments, the reaction temperature may be controlled at 500~1000° C. and the reaction cavity pressure may be controlled at 1~800 Torr;

FIG. 1G illustrates a cap layer 122 can be formed over the second SiGe transition layer 120. The thickness of the cap layer 122 may be controlled between 10-300 angstroms. The content of cap layer may contain Ge in some embodiments, or may not contain Ge in some other embodiments. In some implementations, each or some of layers 116, 118, 120 and 122 may contain SiGe situ doping of B having a concentration of B less than $2\times10^{21}$ cm-3.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A method for forming a p-channel metal-oxide-semiconductor (PMOS) device, the method comprising:
   forming a substrate comprising silicon material;
   etching the substrate to form a cavity; and
   depositing silicon germanium in the cavity to form a SiGe seed layer over a surface of the substrate, a first SiGe transition layer over the SiGe seed layer, a SiGe middle layer over the first SiGe transition layer, and a second SiGe transition layer over the SiGe middle layer, wherein:

the first SiGe transition layer has a germanium (Ge) content increasing from a bottom of the first SiGe transition layer to a top of the first SiGe transition layer, wherein the Ge content in the bottom of the first SiGe transition layer is the same as or higher than the Ge content in the SiGe seed layer;

the SiGe middle layer has a Ge content the same as or higher than the Ge content in the top of the first SiGe transition layer; and the second SiGe transition layer has a Ge content decreasing from a bottom of the second SiGe transition layer to a top of the second SiGe transition layer, wherein the Ge content in the bottom of the second SiGe transition layer is the same as or lower than the Ge content in the SiGe middle layer, and wherein the top of the second SiGe transition layer extends above a surface of the substrate.

2. The method of claim 1, wherein a percentage of the Ge content in the first SiGe transition layer is between 20% to 50%.

3. The method of claim 1, wherein a percentage of the Ge content in the SiGe middle layer is between 30% to 50%.

4. The method of claim 1, wherein a percentage of the Ge content in the second SiGe transition layer is between 0% to 50%.

5. The method of claim 1, wherein the Ge content at the top of the second SiGe transition layer is 0.

6. The method of claim 1, further comprising forming a cap layer over the second SiGe transition layer.

7. The method of claim 1, wherein the first SiGe transition layer is characterized by a thickness between 30 angstroms to 500 angstroms.

8. The method of claim 1, wherein the SiGe middle layer is characterized by a thickness between 100 angstroms to 800 angstroms.

9. The method of claim 1, wherein the second SiGe transition layer is characterized by a thickness between 100 angstroms to 300 angstroms.

10. The method of claim 1, wherein the top of the SiGe middle layer is level with or substantially level with the surface of the substrate.

* * * * *